(12) United States Patent
Ishii et al.

(10) Patent No.: US 9,524,946 B2
(45) Date of Patent: Dec. 20, 2016

(54) ELECTRONIC DEVICE

(71) Applicant: Murata Manufacturing Co., Ltd., Kyoto (JP)

(72) Inventors: Katsumi Ishii, Kyoto (JP); Masashi Yamaura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/466,021

(22) Filed: Aug. 22, 2014

(65) Prior Publication Data

US 2015/0054178 A1 Feb. 26, 2015

(30) Foreign Application Priority Data

Aug. 23, 2013 (JP) ................. 2013-174002

(51) Int. Cl.
*H01L 23/00* (2006.01)
*H01L 23/498* (2006.01)

(52) U.S. Cl.
CPC ......... *H01L 24/14* (2013.01); *H01L 23/49838* (2013.01); *H01L 24/13* (2013.01); *H01L 24/81* (2013.01); *H01L 24/16* (2013.01); *H01L 2224/10165* (2013.01); *H01L 2224/10175* (2013.01); *H01L 2224/131* (2013.01); *H01L 2224/13005* (2013.01); *H01L 2224/13014* (2013.01); *H01L 2224/13082* (2013.01); *H01L 2224/13144* (2013.01); *H01L 2224/13147* (2013.01); *H01L 2224/1403* (2013.01); *H01L 2224/14051* (2013.01);

(Continued)

(58) Field of Classification Search
None
See application file for complete search history.

(56) References Cited

U.S. PATENT DOCUMENTS 7,462,942 B2    12/2008  Tan
2006/0125094 A1*  6/2006  Lin ............................. 257/734
(Continued)

FOREIGN PATENT DOCUMENTS

JP    H11-111771 A    4/1999
JP    2005-101031 A   4/2005
(Continued)

OTHER PUBLICATIONS

Machine Translation of JP 2005-101031 A.*
Office Action issued in Taiwanese Patent Application No. 103128768 dated Oct. 8, 2015.

*Primary Examiner* — Michelle Mandala
(74) *Attorney, Agent, or Firm* — Pearne & Gordon LLP

(57) ABSTRACT

An electronic device includes a surface-mounted component and a mounting component on which the surface-mounted component is mounted, the surface-mounted component includes a first bump and a second bump, a cross-sectional area of which in an in-plane direction of a surface facing the mounting component is larger than that of the first bump, on the surface facing the mounting component, the mounting component includes a first pad that is soldered to the first bump and a second pad soldered to the second bump on the surface facing the surface-mounted component, and a ratio of an area of the second pad to the cross-sectional area of the second bump is larger than a ratio of an area of the first pad to the cross-sectional area of the first bump.

17 Claims, 14 Drawing Sheets

(52) U.S. Cl.
CPC ............ *H01L 2224/14155* (2013.01); *H01L 2224/1601* (2013.01); *H01L 2224/16058* (2013.01); *H01L 2224/16238* (2013.01); *H01L 2224/17519* (2013.01); *H01L 2224/8114* (2013.01); *H01L 2224/81191* (2013.01); *H01L 2224/81385* (2013.01); *H01L 2224/81444* (2013.01); *H01L 2924/1305* (2013.01); *H01L 2924/15787* (2013.01)

(56) References Cited

U.S. PATENT DOCUMENTS

2008/0054460 A1* 3/2008 Hung ............................. 257/737
2015/0008575 A1* 1/2015 Liu et al. ...................... 257/737

FOREIGN PATENT DOCUMENTS

TW          200725841       7/2007
WO          2005/034237 A1  4/2005

* cited by examiner

MOUNTED STATE → CONVERSION → NON-MOUNTED STATE

| PILLAR DIAMETER [μm] | PILLAR RADIUS (r1) [μm] | SOLDER THICKNESS (h1) [μm] | PAD DIAMETER [μm] | PAD RADIUS (r2) [μm] | SOLDER VOLUME [μm³] | PLATING THICKNESS (t) [μm] |
|---|---|---|---|---|---|---|
| 75 | 37.5 | 14 | 85 | 42.5 | 70463 | 15.9 |

MOUNTED STATE → ESTIMATION → NON-MOUNTED STATE

| PILLAR DIAMETER (r1*2) [μm] | PILLAR RADIUS (r1) [μm] | CENTRAL LENGTH (d) [μm] | STRIPE AREA [μm²] | PLATING THICKNESS (t) [μm] | SOLDER VOLUME [μm³] |
|---|---|---|---|---|---|
| 75 | 37.5 | 99.5 | 11880 | 15.9 | 189487 |

MOUNTED STATE

| STRIPE AREA [μm²] | SOLDER THICKNESS (h2) [μm] | SOLDER VOLUME [μm³] | PAD RADIUS (r3) [μm] | PAD WIDTH (r3*2) [μm] | PAD AREA [μm²] | AREA RATIO |
|---|---|---|---|---|---|---|
| 11880 | 14 | 189487 | 45 | 90 | 15246 | 1.3 |
| 11880 | 13 | 189487 | 49 | 98 | 17416 | 1.5 |
| 11880 | 12 | 189487 | 54 | 108 | 19991 | 1.7 |
| 11880 | 11 | 189487 | 60 | 119 | 23089 | 1.9 |
| 11880 | 10 | 189487 | 66 | 132 | 26873 | 2.3 |
| 11880 | 9 | 189487 | 73 | 147 | 31583 | 2.7 |
| 11880 | 8 | 189487 | 82 | 164 | 37584 | 3.2 |
| 11880 | 7 | 189487 | 93 | 185 | 45451 | 3.8 |
| 11880 | 6 | 189487 | 106 | 211 | 56157 | 4.7 |
| 11880 | 5 | 189487 | 122 | 245 | 71472 | 6.0 |

ELECTRONIC DEVICE

BACKGROUND OF THE INVENTION

Field of the Invention

The present invention relates to an electronic device.

Background

A flip-chip mounting technique is known as a technique of mounting a chip on a mounting board. In the flip-chip mounting technique, bumps which are protrusion-like terminals are formed on a chip surface and the bumps are soldered to pads on the mounting board. By employing this mounting technique, it is possible to reduce the area of an electronic device including a chip or to reduce loss due to inductance of interconnections, compared with a case where terminals are formed on the outer circumference of the chip.

In such a flip-chip mounting technique, it has been proposed that heat-dissipation performance is improved through bumps by using bumps (hereinafter, also referred to as "stripe bumps") having a cross-sectional area larger than that of a pillar bump and having a substantially elliptical cross-section in addition to general bumps (hereinafter, also referred to as "pillar bumps") having a substantially circular cross-section (for example, see Patent Document 1).

CITATION LIST

Patent Document

[Patent Document 1] WO2005/034237

SUMMARY OF THE INVENTION

FIG. 13 is a diagram illustrating an example of a chip in which pillar bumps and stripe bumps are mixed. A chip 1300 is provided with pillar bumps 1301a and 1301b and stripe bumps 1302. FIG. 14 is a cross-sectional view taken along line X-X' of the chip 1300. Each stripe bump 1302 has a cross-sectional area larger than that of each pillar bump 1301a and 1301b. Accordingly, as illustrated in FIG. 14, when a solder 1401 is melted, the height in the vicinity of the center of the solder 1401 swelling by the effect of surface tension may be larger than those of solders 1400a and 1400b of the pillar bumps 1301a and 1301b. The stripe bumps 1302 may be formed on transistor cells for the purpose of heat dissipation. In this case, the height of each stripe bump 1302 from the surface of the chip 1300 may be larger than the height of each pillar bump 1301a and 1301b depending on the thickness of the transistor cells. When the height of the stripe bumps 1302 increases, the height of the solders transferred to the stripe bumps 1302 may be larger than the height of the solders transferred to the pillar bumps 1301a and 1301b at the time of transferring the solder to the bumps.

FIG. 15 is a diagram illustrating an example of a state where the chip 1300 is mounted on a mounting board 1500. The mounting board 1500 is provided with pads 1501a and 1501b corresponding to the pillar bumps 1301a and 1301b and pads 1502 corresponding to the stripe bumps 1302. In the example illustrated in FIG. 15, the stripe bumps 1302 are satisfactorily bonded to the pads 1502 by the solders 1401, but the pillar bumps 1301a and 1301b are defectively bonded to the pads 1501a and 1501b. This bonding failure attributes to the difference between the height of the solders 1400a and 1400b and the height of the solders 1401.

The present invention is made in consideration of the above-mentioned circumstances, and an object thereof is to improve connectivity between bumps and pads in an electronic device that is subjected to a flip-chip mounting process using a first bump and a second bump having a cross-sectional area larger than that of the first bump.

According to an aspect of the present invention, there is provided an electronic device comprising: a surface-mounted component; and a mounting component on which the surface-mounted component is mounted, wherein the surface-mounted component includes a first bump and a second bump, a cross-sectional area of which in an in-plane direction of a surface facing the mounting component is larger than that of the first bump, on the surface facing the mounting component, wherein the mounting component includes a first pad that is soldered to the first bump and a second pad soldered to the second bump on the surface facing the surface-mounted component, and wherein a ratio of an area of the second pad to the cross-sectional area of the second bump is larger than a ratio of an area of the first pad to the cross-sectional area of the first bump.

According to the present invention, it is possible to improve connectivity between bumps and pads in an electronic device that is subjected to a flip-chip mounting process using a first bump and a second bump having a cross-sectional area larger than that of the first bump.

DESCRIPTION OF THE PREFERRED EMBODIMENTS

Figure 1:
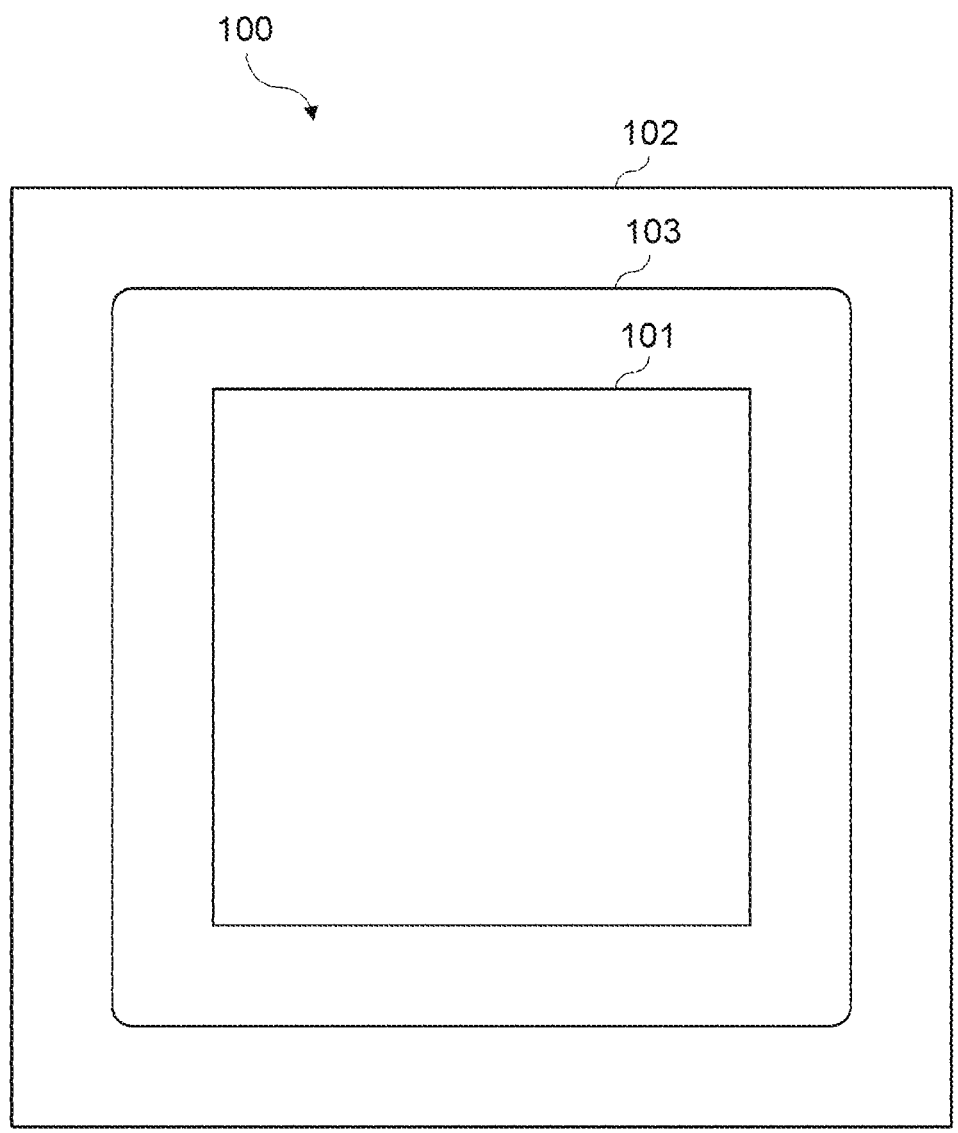
FIG. 1 is a diagram illustrating an example of an outline of an electronic device according to an embodiment of the present invention.

Hereinafter, an embodiment of the present invention will be described with reference to the accompanying drawings. FIG. 1 is a diagram illustrating an example of an outline of an electronic device according to an embodiment of the present invention. The electronic device 100 has a configuration in which a surface-mounted component is mounted on a mounting component. In the example illustrated in FIG. 1, the electronic device 100 includes a chip 101 as a surface-mounted component and a mounting board 102 as a mounting component and a space between the chip 101 and the mounting board 102 is sealed by a sealing resin 103.

Figure 2:
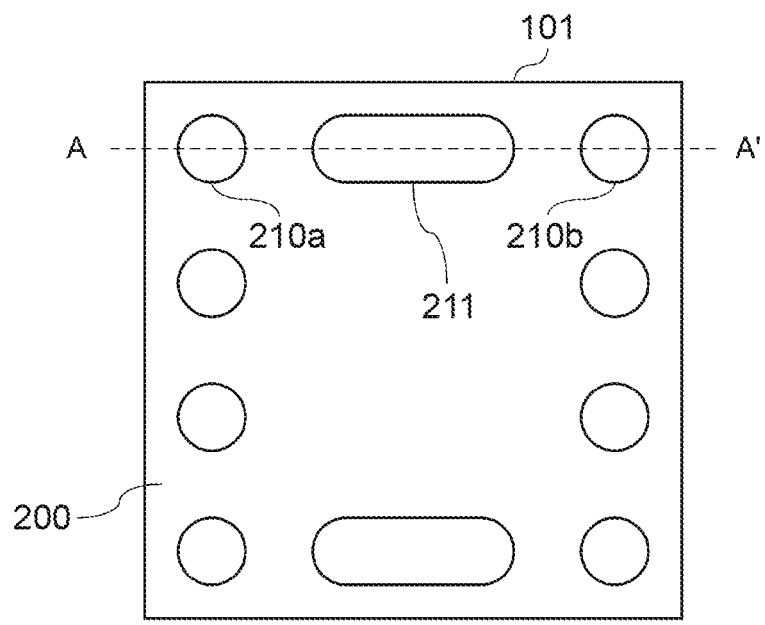
FIG. 2 is a diagram illustrating an example of an arrangement of bumps on a chip.
Figure 3:
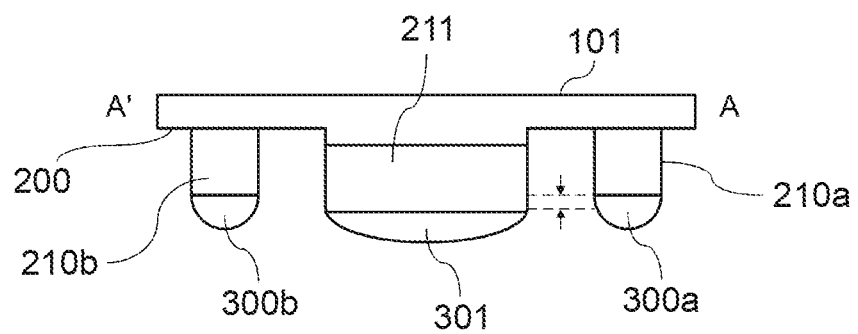
FIG. 3 is a cross-sectional view taken along line A-A' of FIG. 2.

FIG. 2 is a diagram illustrating an example of an arrangement of bumps on the chip 101. FIG. 3 is a cross-sectional view taken along line A-A' of FIG. 2. A surface 200 is a surface facing the mounting board 102. Plural bumps are formed on the surface 200 so as to protrude from the surface 200. Specifically, the chip 101 is provided with bumps 211 (hereinafter, referred to as "stripe bumps") having a substantially elliptical cross-section in addition to bumps (hereinafter, referred to as "pillar bumps") 210a and 210b having a substantially circular cross-section. The pillar bumps 210a, 210b (first bump) and the stripe bumps 211 (second bump) have substantially the same width (in the vertical direction in FIG. 2), but the stripe bumps 211 have a larger length (in the horizontal direction in FIG. 2). That is, the stripe bumps 211 are larger in the cross-sectional area on the surface 200 than the pillar bumps 210a, 210b. So long as the cross-sectional area of the respective stripe bumps 211 is larger than the cross-sectional area of the respective pillar bumps 210a, 210b, the shapes of the bumps are not limited to those illustrated in FIG. 2.

The pillar bumps 210a, 210b and the stripe bumps 211 are provided to electrically connect circuits in the chip 101 to the outside or to dissipate heat generated in the chip 101, and are formed of, for example, copper (Cu) or gold (Au). Solders 300a and 300b for connection to the pads on the mounting board 102 are formed on the tips of the pillar bumps 210a and 210b. Similarly, solders 301 are formed on the tips of the stripe bumps 211.

The stripe bumps 211 are used to reduce impedance of, for example, interconnections or to improve heat dissipation performance. Specifically, the stripe bumps 211 may be formed on transistor cells such as hetero-junction bipolar transistors for the purpose of heat dissipation. In this case, as illustrated in FIG. 3, the height of the stripe bumps 211 from the surface 200 of the chip 101 may be larger, for example, by about 4 μm to 6 μm than the height of the pillar bumps 210a, 210b depending on the thickness of the transistor cells. Accordingly, the solders may be transferred to the pillar bumps 210a, 210b and the stripe bumps 211 so that the heights from the surface 200 of the chip 101 to the tips of the solders are equal to each other.

Figure 4:
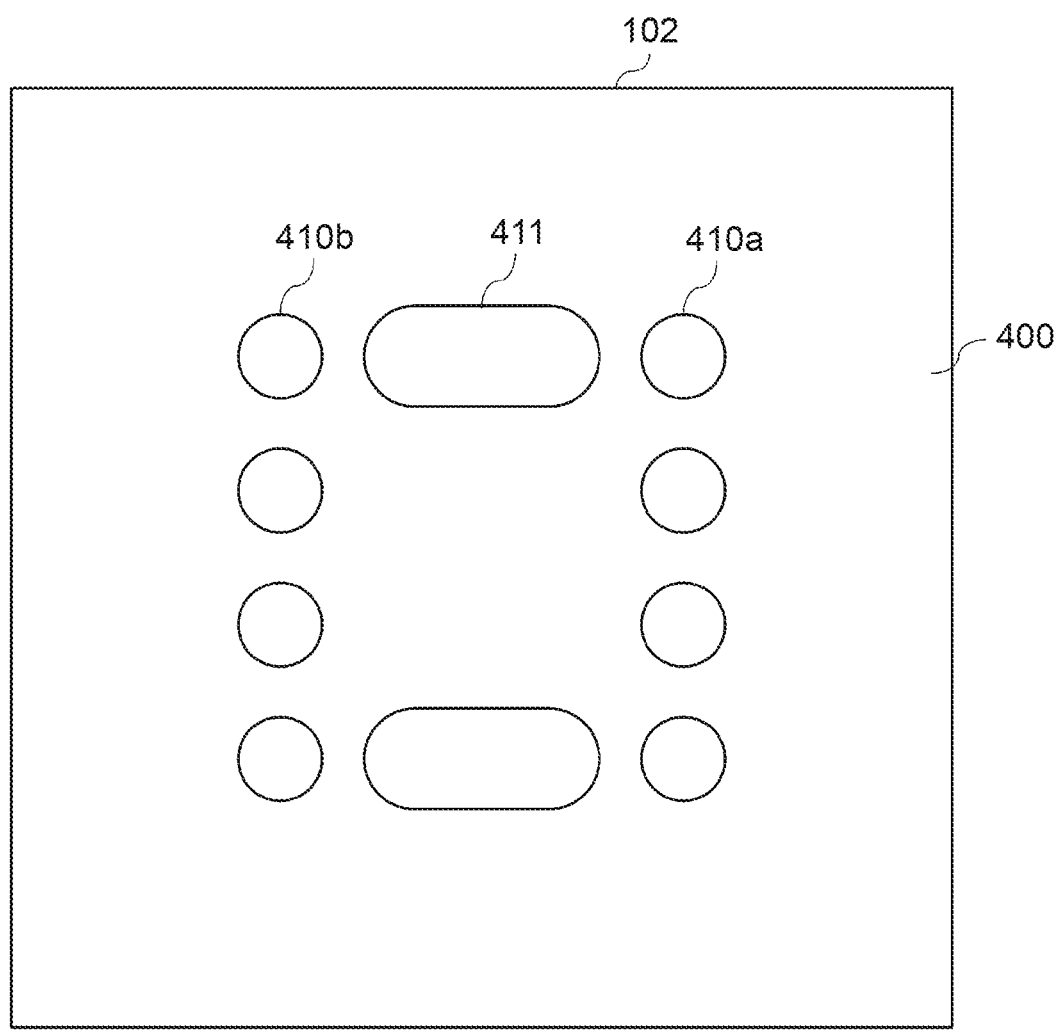
FIG. 4 is a diagram illustrating an example of an arrangement of pads on a mounting board.

FIG. 4 is a diagram illustrating an example of an arrangement of pads on the mounting board 102. The mounting board 102 is, for example, a ceramic board which is an insulating board or a printed circuit board (PCB). A surface 400 is a surface facing the chip 101. The surface 400 is provided with plural pads that are soldered to the bumps of the chip 101. Specifically, as illustrated in FIG. 4, pads 410a and 410b (first pad) that are soldered to the pillar bumps 210a and 210b of the chip 101 are formed. Similarly, pads 411 (second pad) that are soldered to the stripe bumps 211 of the chip 101 are formed. The pads 410a, 410b, and 411 are subjected to, for example, nickel (Ni) plating, palladium (Pa) plating, and gold (Au) plating. The pads 411 that are soldered to the stripe bumps 211 are connected to, for example, ground potential (ground).

Figure 5:
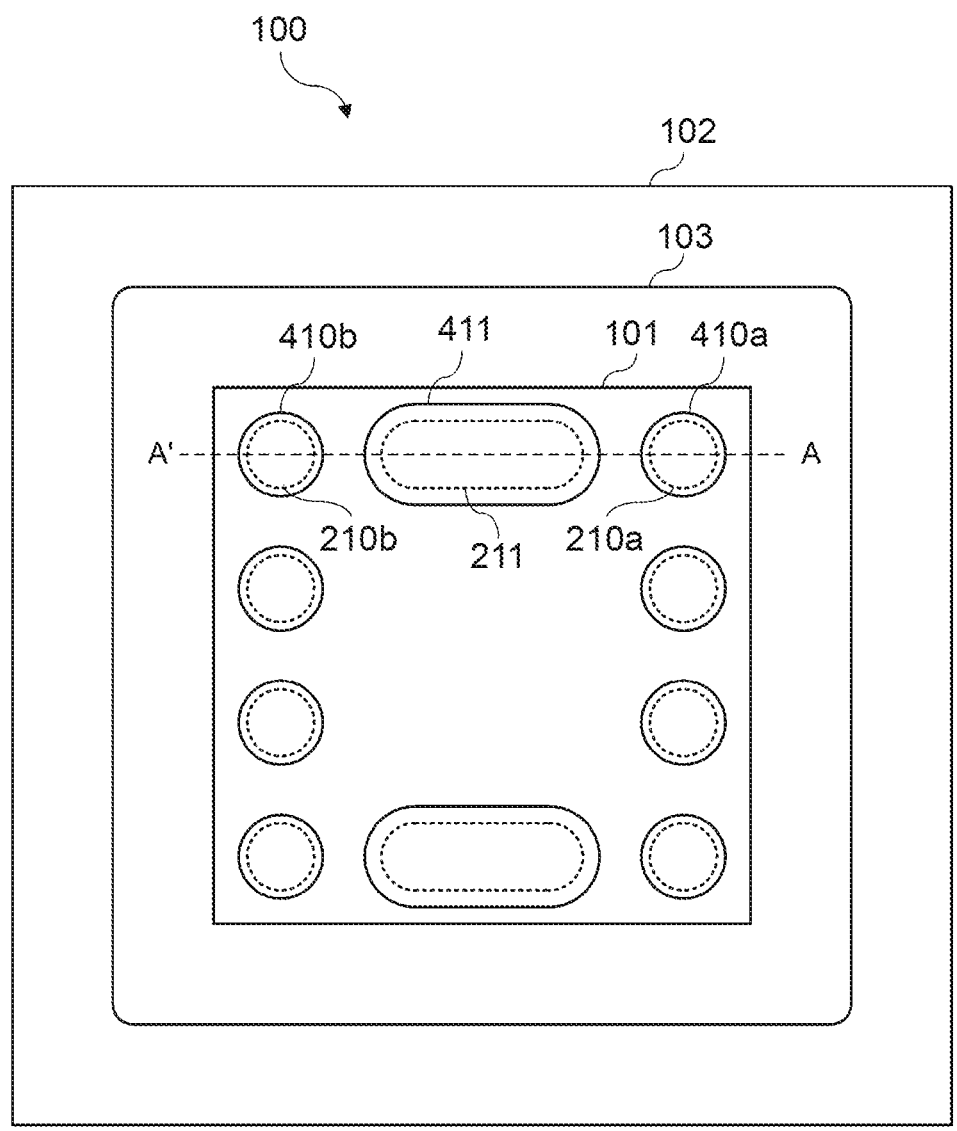
FIG. 5 is a diagram illustrating an example of a state where a chip is mounted on a mounting board.

FIG. 5 is a diagram illustrating an example of a state where the chip 101 is mounted on the mounting board 102. In FIG. 5, the bumps formed on the chip 101 are indicated by dotted lines. As illustrated in FIG. 5, the pads 410a, 410b, and 411 have sizes larger than the cross-sectional areas of the bumps 210a, 210b, and 211, respectively. For example, the radius of the pillar bumps 210a, 210b may be set to 75 μm and the radius of the pads 410a, 410b may be set to 85 μm. In this case, the ratio of the area of each pad 410a, 410b to the cross-sectional area of each pillar bump 210a, 210b is equal to about 1.3:1. In contrast, the ratio of the area of the respective pads 411 to the cross-sectional area of the respective stripe bumps 211 may be, for example, set to about 2:1. That is, the ratio of the area of the respective pads 411 to the cross-sectional area of the respective stripe bumps 211 is set to be larger than the ratio of the area of the respective pads 410a, 410b to the cross-sectional area of the respective pillar bumps 210a, 210b.

Figure 6:
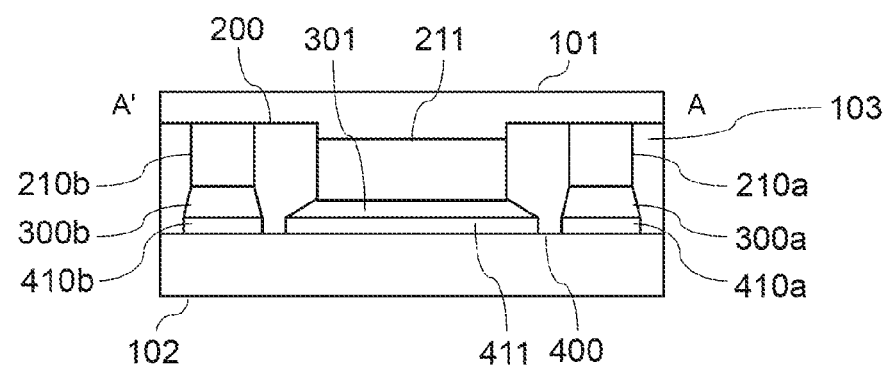
FIG. 6 is a cross-sectional view taken along line A-A' of FIG. 5.

FIG. 6 is a cross-sectional view taken along line A-A' of FIG. 5. Since the ratio of the area of the respective pads 411 to the cross-sectional area of the stripe bumps 211 is set to be relatively larger as described above, the degree of spread of the application of solders 301 formed on the respective stripe bumps 211 is larger than the degree of spread of the application of the solders 300a, 300b formed on the respective pillar bumps 210a, 210b. Accordingly, compared with a case where the area ratio of the bumps and the pads is constant for the pillar bumps 210a, 210b and the stripe bumps 211, the degree of sinking of the stripe bumps 211 is higher and the connectivity between the pillar bumps 210a, 210b and the pads 410a, 410b is improved.

Figure 7:
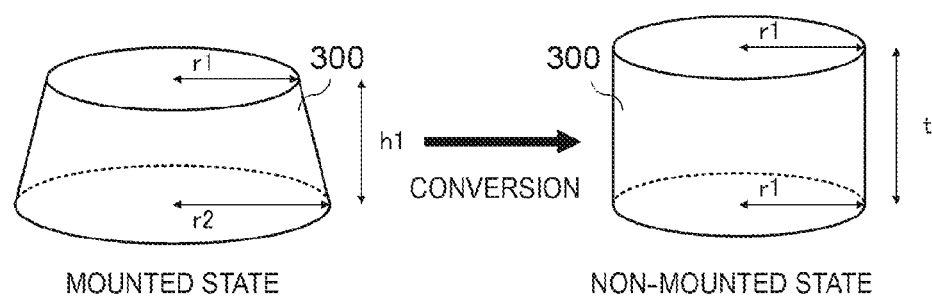
FIG. 7 is a diagram illustrating an example of an outline of a solder in a mounted state and a non-mounted state.

An example of simulation for determining the size of the pads 411 that are soldered to the stripe bumps 211 will be described below with reference to FIGS. 7 to 11. FIG. 7 is a diagram illustrating an example of the outline of a solder 300 in a state (mounted state) where the chip 101 is mounted on the mounting board 102 and a state (non-mounted state) where the chip 101 is not mounted on the mounting board 102. Here, for example, the radius (pillar radius r1) of the cross-section of each pillar bump 210a, 210b is set to 37.5 μm, the radius (pad radius r2) of each pad 410a, 410b is set to 42.5 μm, and the height (solder thickness h1) of the solder 300 in the mounted state is set to 14 μm. When the solder 300 is applied to and spread to the entire surface of each pad 410a, 410b in the mounted state, the shape of the solder 300 is changed to the shape illustrated in the left part of FIG. 7. In this case, the ratio of the area of each pad 410a, 410b to the cross-sectional area of the pillar bump is about 1.3:1. In this condition, the volume of the solder 300 (truncated cone) in the mounted state is calculated to be 70463 μm³. The height (plating thickness t) of the solder 300 in the non-mounted state is calculated to be 15.9 μm on the basis of the calculated volume.

Figure 8:
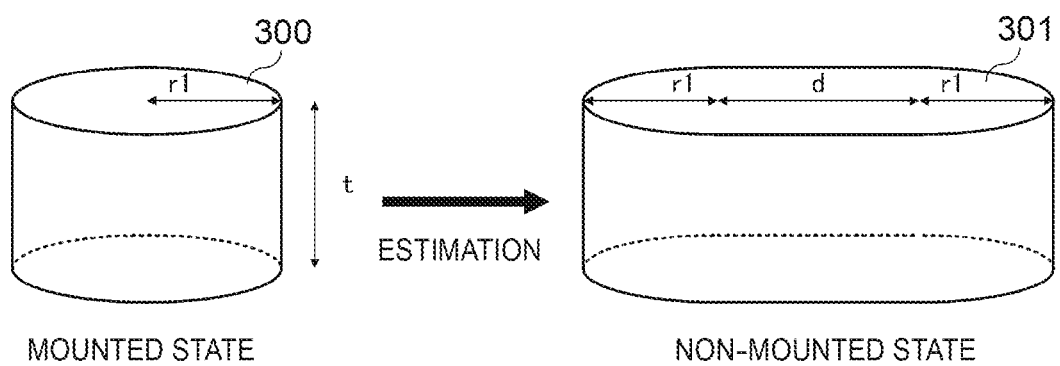
FIG. 8 is a diagram illustrating an example of a shape of a solder in an estimated non-mounted state.

FIG. 8 is a diagram illustrating an example of the shape of the solder 301 in the non-mounted state which is estimated from the shape of the solder 300 in the non-mounted state. In order to simplify the simulation, it is assumed that the amount of solder applied per unit area of the bump is fixed in the solders 300 and 301. The lengths in the short-side direction (width) of the solders 300 and 301 are set to be equal to each other (r1×2). For example, the length (central length d) other than both end portions (r1×2) in the long-side direction of the stripe bump 211 is set to 99.5 μm. When the height (plating thickness t) of the solder 301 in the non-mounted state is equal to that of the solder 300, the solder 301 in the non-mounted state has an area (stripe area) of 11880 μm² in the surface in contact with the stripe bump 211 and a volume of 189487 μm³.

Figure 9:
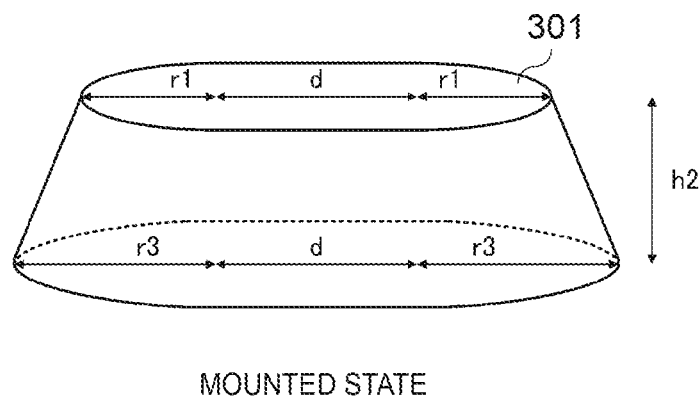
FIG. 9 is a diagram illustrating an example of a shape of a solder in a mounted state.

FIG. 9 is a diagram illustrating an example of the shape of the solder 301 in the mounted state. When the solder 301 is applied and spread to the entire surface of the pad 411 in the mounted state, the shape of the solder 301 is the same as illustrated in FIG. 9. In this shape, the area of the pad 411 is calculated using the volume of the solder 301 set to 189487 μm³.

Figures 10, 11:
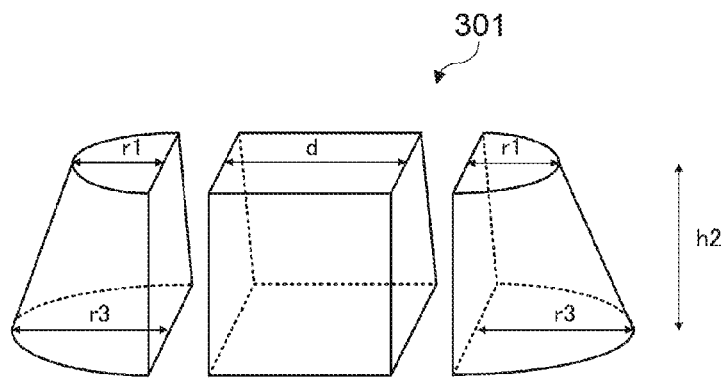
FIG. 10 is a diagram illustrating an example where a solder in the mounted state is divided into three structures.
FIG. 11 is a diagram illustrating examples of a pad area corresponding to a height of a solder.

FIG. 10 is a diagram illustrating an example where the solder 301 in the mounted state is divided into three structures. The right and left structures are halves of a truncated cone of which the radius of the top surface is r1 and the radius (pad radius) of the bottom surface is r3. The central structure is a truncated pyramid of which the top surface has a length d in the horizontal direction and a length r1×2 in the depth direction and the bottom surface has a length d in the horizontal direction and a length (pad width) r3×2 in the depth direction.

FIG. 11 illustrates the area (pad area) of the pad 411, corresponding to the height (solder thickness h2) of the solder 301, which is calculated under the above conditions. When the height (solder thickness h2) of the solder 301 is 14 μm which is equal to the height (solder thickness h1) of the solder 300, the area (pad area) of the pad 411 is 15246 μm². In this case, the ratio (area ratio) of the area (pad area) of the pad 411 to the cross-sectional area (stripe area) of the stripe bump 211 is about 1.3:1.

In practice, as described above, the height of the stripe bump 211 from the surface 200 of the chip 101 may be higher than the height of the pillar bumps 210a, 210b. For example, when the height difference is 4 μm, the height (solder thickness h2) of the solder 301 is lowered by the difference. That is, in this simulation, the height (solder thickness h2) of the solder 301 is 10 μm. In this case, the area (pad area) of the pad 411 is 26873 μm² and the area ratio is about 2.3:1. That is, the ratio of the area of the pad 411 to the cross-sectional area of the stripe bump 211 is larger than the ratio of the area of each pad 410a, 410b to the cross-sectional area of each pillar bump 210a, 210b.

In this way, by forming the pad 411 so that the ratio of the area of the pad 411 to the cross-sectional area of the stripe bump 211 is larger than the ratio of the area of each pad 410a, 410b to the cross-sectional area of each pillar bump 210a, 210b, the degree of sinking of the stripe bump 211 is higher than the degree of sinking of each pillar bump 210a, 210b and it is thus possible to improve connectivity between the pillar bumps 210a, 210b and the pads 410a, 410b.

A positioning mechanism for limiting movement of the stripe bump 211 to a predetermined range of the pad 411 will be described below with reference to FIGS. 12A to 12F.

Figure 12A:
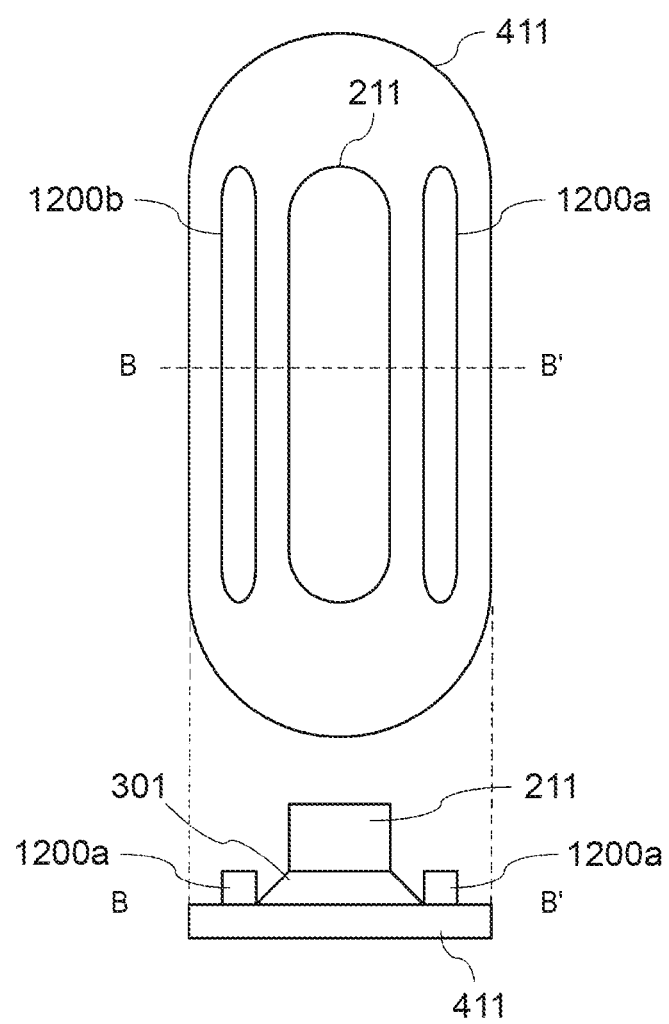
FIG. 12A is a diagram illustrating an example of a positioning mechanism formed in a pad.

FIG. 12A is a diagram illustrating an example of the positioning mechanism formed in the pad 411. As illustrated in FIG. 12A, the pad 411 is provided with positioning mechanisms 1200a and 1200b at positions (outer circumference of a predetermined range) parallel to the side in the long-side direction. The positioning mechanisms 1200a, 1200b are formed of, for example, a solder resist (resist) on the surface of the pad 411. As illustrated in the lower part of FIG. 12A, by limiting the flow of the solder 301 in the right and left directions of FIG. 12A by the positioning mechanisms 1200a, 1200b, it is possible to limit the movement of the stripe bump 211 between the positioning mechanisms 1200a and 1200b (to a predetermined range). The positioning mechanisms 1200a and 1200b form flow channels (for example, in the vertical direction in FIG. 12A) for applying and spreading the solder 301. Accordingly, as in the example illustrated in FIG. 6, the degree of sinking of the stripe bump 211 is higher than the degree of sinking of each pillar bump 210a, 210b and it is thus possible to improve the connectivity between the pillar bumps 210a, 210b and the pads 410a, 410b.

Figure 12B:
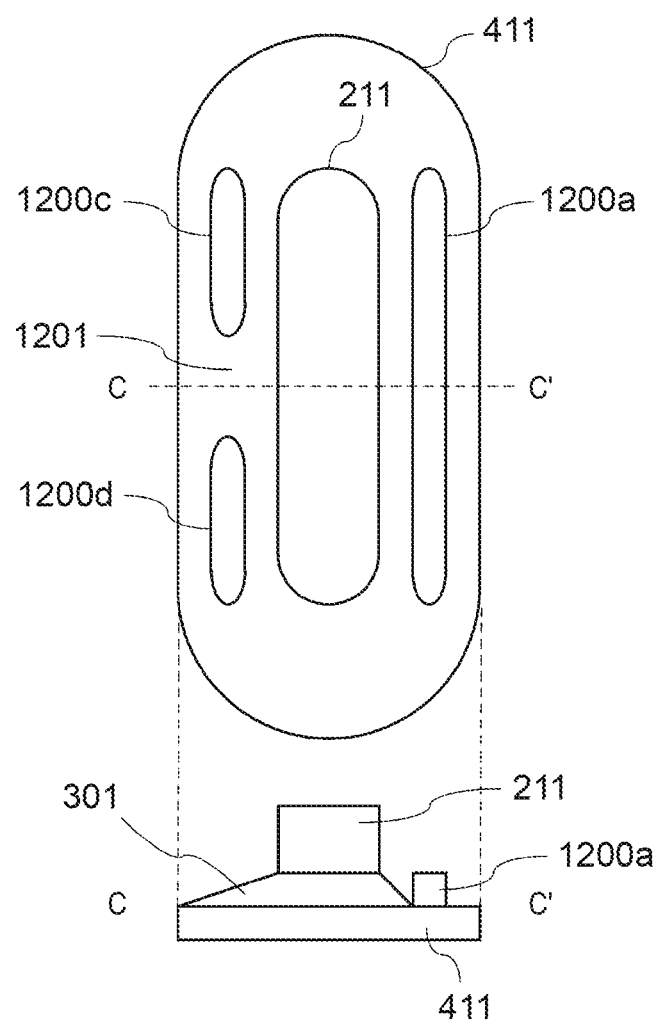
FIG. 12B is a diagram illustrating another example of the positioning mechanism formed in a pad.

FIG. 12B is a diagram illustrating another example of the positioning mechanism formed in the pad 411. In the configuration illustrated in FIG. 12B, positioning mechanisms 1200c and 1200d are formed instead of the positioning mechanisms 1200b illustrated in FIG. 12A. A gap 1201 (flow channel) is formed between the positioning mechanisms 1200c and 1200d. Accordingly, similarly to the example illustrated in FIG. 12A, the movement of the stripe bump 211 is limited between the positioning mechanisms 1200a, 1200c, and 1200d (to the predetermined range). As illustrated in the lower part of FIG. 12B, since the solder 301 is applied and spread from the gap 1201 between the positioning mechanisms 1200c and 1200d, it is possible to increase the degree of spread of the application of solder 301.

Figure 12C:
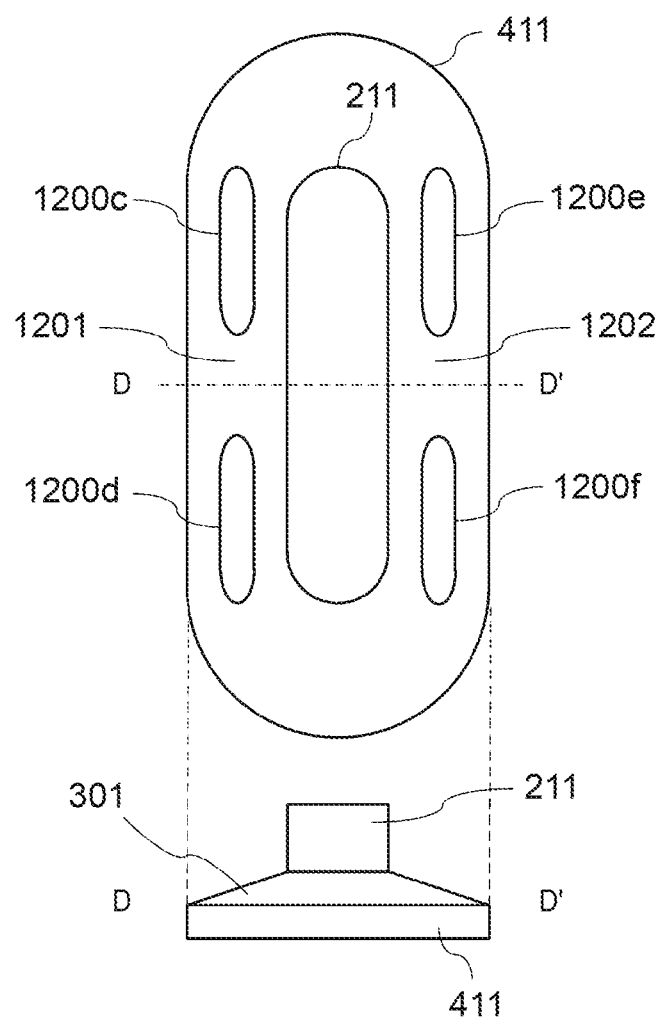
FIG. 12C is a diagram illustrating still another example of the positioning mechanism formed in a pad.

FIG. 12C is a diagram illustrating still another example of the positioning mechanism formed in the pad 411. In the configuration illustrated in FIG. 12C, positioning mechanisms 1200e and 1200f are formed instead of the positioning mechanism 1200a illustrated in FIG. 12B. A gap 1202 (flow channel) is formed between the positioning mechanisms 1200e and 1200f. Accordingly, similarly to the example illustrated in FIG. 12A, the movement of the stripe bump 211 is limited between the positioning mechanisms 1200c to 1200f (to the predetermined range). As illustrated in the lower part of FIG. 12C, since the solder 301 is applied and spread from the gap 1202 between the positioning mechanisms 1200e and 1200f in addition to the gap 1201 between the positioning mechanisms 1200c and 1200d, it is possible to increase the degree of spread of the application of the solder 301.

Figure 12D:
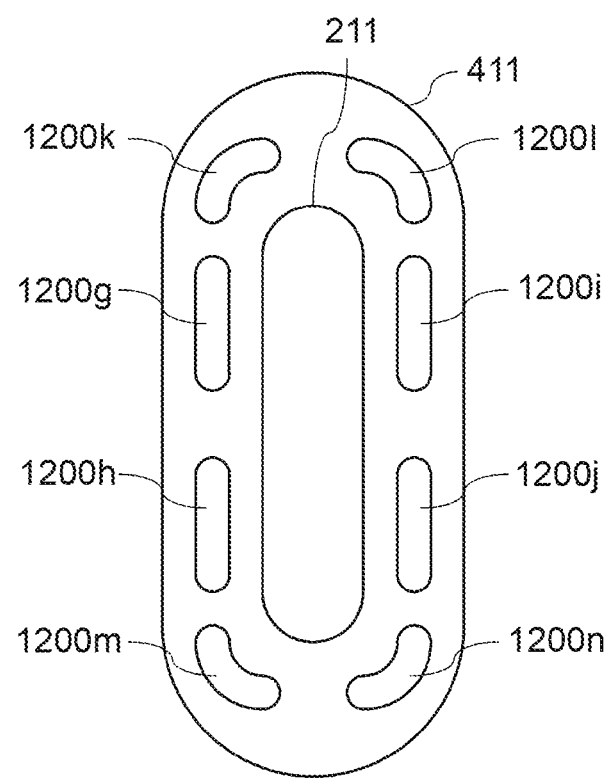
FIG. 12D is a diagram illustrating still another example of the positioning mechanism formed in a pad.

FIG. 12D is a diagram illustrating still another example of the positioning mechanism formed in the pad 411. In the configuration illustrated in FIG. 12D, plural positioning mechanisms 1200g to 1200n are formed at positions (the outer circumference of the predetermined range) along the outer circumference of the pad 411. The positioning mechanisms 1200g to 1200j out of the plural positioning mechanisms 1200g to 1200n can limit the movement of the stripe bump 211 in the right and left directions of FIG. 12D, similarly to the positioning mechanisms 1200c to 1200f illustrated in FIG. 12C. In the configuration illustrated in FIG. 12D, the movement of the stripe bump 211 can also be limited in the vertical direction of FIG. 12D by the positioning mechanisms 1200k to 1200n.

Figure 12E:
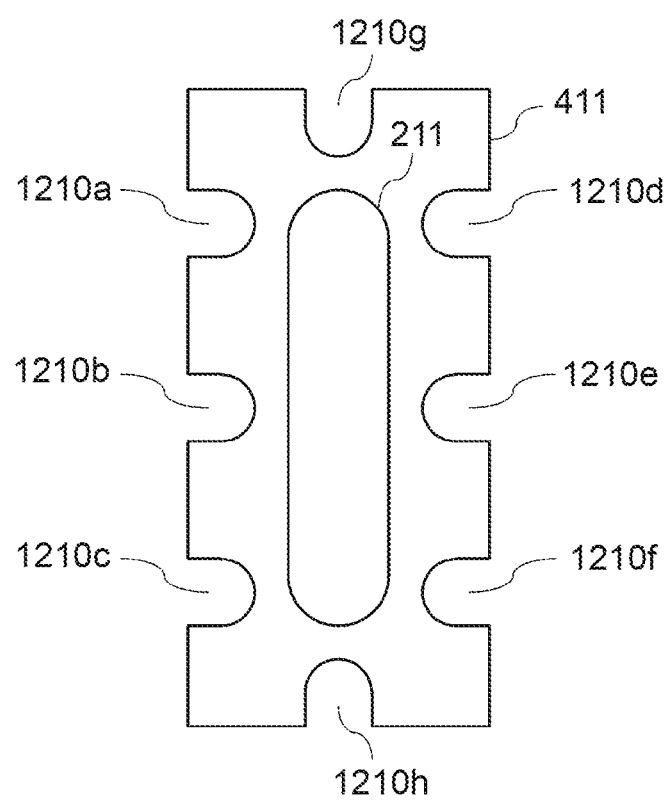
FIG. 12E is a diagram illustrating still another example of the positioning mechanism formed in a pad.

FIG. 12E is a diagram illustrating still another example of the positioning mechanism formed in the pad 411. As illustrated in FIG. 12E, positioning mechanisms 1210a to 1210h are formed on the outer circumference (the outer circumference of the predetermined range) of the pad 411. The positioning mechanisms 1210 are openings (slits) formed on the outer circumference of the pad 411. The positioning mechanisms 1210a to 1210f can limit the movement of the stripe bump 211 in the right and left directions of FIG. 12E, similarly to the positioning mechanisms 1200g to 1200j illustrated in FIG. 12D. The positioning mechanisms 1210g and 1210h can also limit the movement of the stripe bump 211 in the vertical direction of FIG. 12E, similarly to the positioning mechanisms 1200k to 1200n illustrated in FIG. 12D.

Figure 12F:
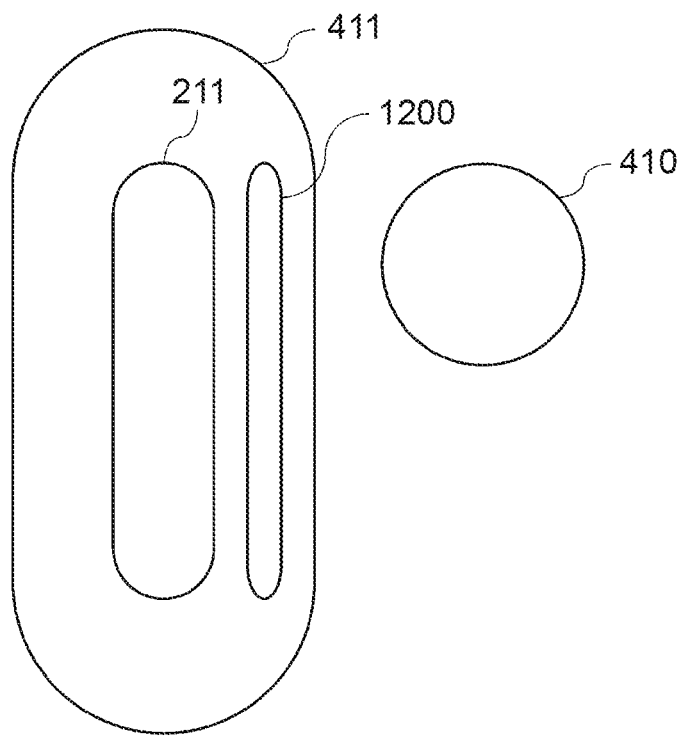
FIG. 12F is a diagram illustrating still another example of the positioning mechanism that is arranged in consideration of a position of a pad.
Figure 13:
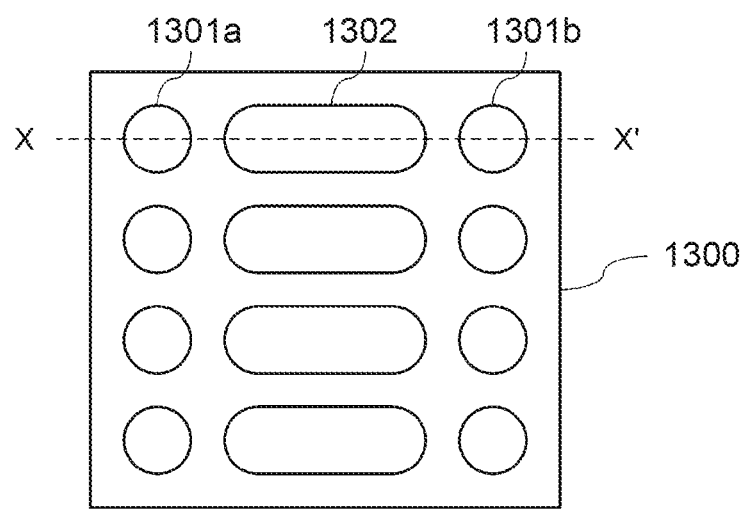
FIG. 13 is a diagram illustrating an example of a chip in which pillar bumps and stripe bumps are mixed.
Figure 14:
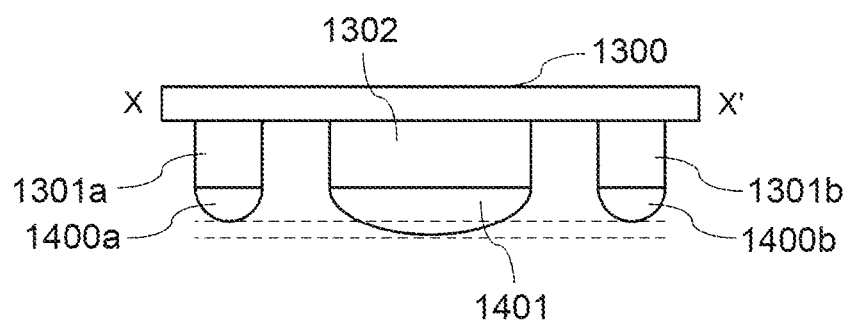
FIG. 14 is a cross-sectional view taken along line X-X' of the chip.
Figure 15:
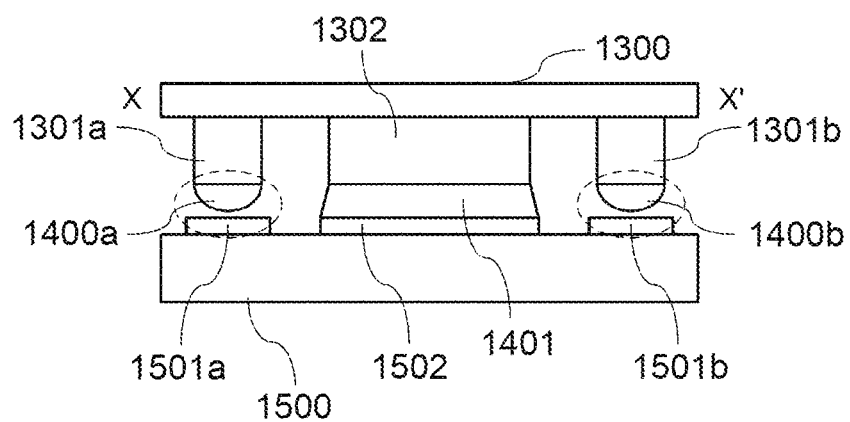
FIG. 15 is a diagram illustrating an example of a state where the chip is mounted on a mounting board.

FIG. 12F is a diagram illustrating an example of a positioning mechanism that is arranged in consideration of the position of the pad 410. When the pad 410 and the pad 411 are arranged close to each other as illustrated in FIG. 12F, the positioning mechanism 1200 can be formed on the side of the pad 411 close to the pad 410. In this way, by forming the positioning mechanism 1200 on the side of the pad 411 close to the pad 410, it is possible to prevent the solder 301 from being applied and spread over the pad 411 to the pad 410. The same is true of the case where the positioning mechanisms 1210 illustrated in FIG. 12E are formed.

This embodiment has been described hitherto. According to this embodiment, the ratio of the area of the pad 411 to the cross-sectional area of the stripe bump 211 is larger than the ratio of the area of the pad 410 to the cross-sectional area of the pillar bump (not shown). Accordingly, the degree of spread of the application of solder 301 formed on the stripe bump 211 is larger than that of the solder 300 formed on each pillar bump (not shown). Therefore, compared with the case where the area ratio of the bump and the pad is the same in the pillar bump (not shown) and the stripe bump 211, the degree of sinking of the stripe bump 211 is higher than the degree of sinking of the pillar bump and it is thus possible to improve the connectivity between the pillar bump (not shown) and the pad 410. The area of the pad 411 can be calculated, for example, using the simulation illustrated in FIGS. 7 to 11.

By forming the positioning mechanism on the pad 411 as illustrated in FIGS. 12A to 12F, it is possible to limit the movement of the bump 211 to the predetermined range of the pad 411. Accordingly, it is possible to improve the connectivity between the bump 211 and the pad 411.

By forming the positioning mechanism along two opposite sides as illustrated in FIGS. 12A to 12E, it is possible to limit the movement of the pad 411 to the range (predetermined range) surrounded with the two sides.

By forming the flow channel of the solder 301 on at least one side of the two opposite sides as illustrated in FIGS. 12B to 12E, it is possible to increase the degree of spread of the application of the solder 301.

By forming the positioning mechanism on the side of the pad 411 close to the pad 410 as illustrated in FIG. 12F, it is possible to prevent the solder 301 from being applied and spread over the pad 411 to the pad 410.

This embodiment is described to facilitate understanding of the present invention and is not intended for limiting the present invention. The present invention can be modified/improved without departing from the gist thereof and equivalents thereof are included in the present invention.

For example, although this embodiment has described that the chip 101 is the surface-mounted component and the mounting board 102 is the mounting component, the combination of the surface-mounted component and the mounting component is not limited to this embodiment and arbitrary components may be used as long as they can be flip-chip bonded. For example, the present invention may be applied to chip-on-chip bonding which is an example of the flip-chip bonding. That is, both the surface-mounted component and the mounting component may be chips.

For example, although this embodiment has described above that a bump having a small cross-sectional area is used as the pillar bump and a bump having a large cross-sectional area is used as the stripe bump, the shape of the bumps is not limited to this example and the bumps may have an arbitrary shape.

REFERENCE SIGNS LIST

100: electronic device
101, 1300: chip
102, 1500: mounting board
103: sealing resin
200: surface
210a, 210b, 1301a, 1301b: bumps (pillar bumps)
211, 1302: bumps (stripe bumps)
300, 300a, 300b, 301, 1400a, 1400b, 1401: solder
400: surface
410, 410a, 410b, 411, 1501a, 1501b, 1502: pad
1200, 1200a, 1200b, 1200c, 1200d, 1200e, 1200f, 1200g, 1200h, 1200i, 1200j, 1200k, 1200l, 1200m, 1200n: positioning mechanism (solder resist)
1210a, 1210b, 1210c, 1210d, 1210e, 1210f, 1210g, 1210h: positioning mechanism (opening)

What is claimed is:

1. An electronic device comprising:
a surface-mounted component; and
a mounting component on which the surface-mounted component is mounted,
wherein the surface-mounted component includes a first bump and a second bump that are horizontally adjacent to each other, an area of an upper surface of the second bump in an in-plane direction of a surface facing the mounting component is larger than an area of an upper surface of the first bump in the in-plane direction of the surface facing the mounting component,
wherein the first bump has a circular cross section in the in-plane direction and the second bump has an elliptical cross section in the in-plane direction,
wherein the mounting component includes a first pad soldered to the first bump and a second pad soldered to the second bump on the surface facing the surface-mounted component, and
wherein a ratio of an area of a lower surface of the second pad to the area of the upper surface of the second bump in the in-plane direction is larger than a ratio of an area of a lower surface of the first pad to the area of the upper surface of the first bump in the in-plane direction.

2. The electronic device according to claim 1, wherein the mounting component is a mounting board, and
wherein the second bump dissipates heat generated from the surface-mounted component to the mounting board.

3. The electronic device according to claim 1, wherein the second pad includes a positioning mechanism configured to limit movement of the second bump to a range within the second pad and form a solder flow channel toward the outside of the range.

4. The electronic device according to claim 3, wherein the positioning mechanism is a resist formed on an outer circumference of the range of the second pad.

5. The electronic device according to claim 3, wherein the positioning mechanism is an opening formed on the outer circumference of the range of the second pad.

6. The electronic device according to claim 3, wherein the positioning mechanism is formed along two opposite sides of the range in a long-side direction of the second pad.

7. The electronic device according to claim 6, wherein the positioning mechanism is configured to form the flow channel on at least one side of the two opposite sides.

8. The electronic device according to claim 3, wherein the positioning mechanism is formed on one side of the second pad closer to the first pad in a long-side direction of the second pad.

9. The electronic device according to claim 1, wherein a length of a second cross-section comprising the surface-mounted component, the second bump, the solder, and the second pad, the second cross-section perpendicularly passing through the upper surface of the second bump, is the same as a length of a first cross-section comprising the surface-mounted component, the first bump, the solder, and the first pad, the first cross-section perpendicularly passing through the upper surface of the first bump.

10. The electronic device according to claim 1, wherein the ratio of the area of the lower surface of the second pad to the area of the upper surface of the second bump is larger than the ratio of the area of the lower surface of the first pad to the area of the upper surface of the first bump only when a length of a second cross-section comprising the surface-mounted component and the second bump is larger than a length of a first cross-section comprising the surface mounted component and the first bump, the second cross-section perpendicularly passing through the upper surface of the second bump and the first cross-section perpendicularly passing through the upper surface of the first bump.

11. The electronic device according to claim 2, wherein the second pad includes a positioning mechanism configured to limit movement of the second bump to a range within the second pad and form a solder flow channel toward the outside of the range.

12. The electronic device according to claim 4, wherein the positioning mechanism is formed along two opposite sides of the range in a long-side direction of the second pad.

13. The electronic device according to claim 5, wherein the positioning mechanism is formed along two opposite sides of the range in a long-side direction of the second pad.

14. The electronic device according to claim 4 wherein the positioning mechanism is formed on one side of the second pad closer to the first pad in a long-side direction of the second pad.

15. The electronic device according to claim 5 wherein the positioning mechanism is formed on one side of the second pad closer to the first pad in a long-side direction of the second pad.

16. The electronic device according to claim 6 wherein the positioning mechanism is formed on one side of the second pad closer to the first pad in a long-side direction of the second pad.

17. The electronic device according to claim 7 wherein the positioning mechanism is formed on one side of the second pad closer to the first pad in a long-side direction of the second pad.

* * * * *